(12) United States Patent
Matsuhashi

(10) Patent No.: US 6,856,501 B2
(45) Date of Patent: Feb. 15, 2005

(54) CAPACITOR HAVING COPPER ELECTRODES AND DIFFUSION BARRIER LAYERS

(75) Inventor: Hideaki Matsuhashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/822,757

(22) Filed: Apr. 13, 2004

(65) Prior Publication Data

US 2004/0190220 A1 Sep. 30, 2004

Related U.S. Application Data

(62) Division of application No. 09/685,586, filed on Oct. 11, 2000, now Pat. No. 6,759,703.

(30) Foreign Application Priority Data

Jun. 26, 2000 (JP) .................................. 2000/190411

(51) Int. Cl.[7] .................................................. H01G 4/06
(52) U.S. Cl. ..................... 361/321.1; 361/321.2; 361/321.5; 361/306.1; 361/306.3; 361/311; 361/320; 438/396; 438/397
(58) Field of Search ................... 361/321.1, 321.2, 361/321.5, 306.1, 306.3, 301.4, 302, 311, 313, 320; 438/396, 397, 244, 245

(56) References Cited

U.S. PATENT DOCUMENTS

| | | | |
|---|---|---|---|
| 5,661,334 A | | 8/1997 | Akram |
| 5,976,928 A | * | 11/1999 | Kirlin et al. ................. 438/240 |
| 6,008,083 A | * | 12/1999 | Brabazon et al. ............ 438/239 |
| 6,180,976 B1 | * | 1/2001 | Roy ............................ 257/306 |
| 6,184,551 B1 | * | 2/2001 | Lee et al. .................... 257/310 |
| 6,207,552 B1 | * | 3/2001 | Wang et al. ................. 438/618 |
| 6,320,244 B1 | | 11/2001 | Alers et al. |
| 6,346,454 B1 | | 2/2002 | Sung et al. |
| 6,426,249 B1 | * | 7/2002 | Geffken et al. ............. 438/239 |

* cited by examiner

Primary Examiner—Dean A. Reichard
Assistant Examiner—Nguyen T. Ha
(74) Attorney, Agent, or Firm—Volentine Francos & Whitt, PLLC

(57) ABSTRACT

A capacitor has a couple of electrodes with a dielectric placed therebetween. At least one of the electrodes is made of copper, and barriers for preventing the diffusion of copper into the dielectric are provided between the dielectric and the copper electrode, respectively.

10 Claims, 11 Drawing Sheets

CAPACITOR HAVING COPPER ELECTRODES AND DIFFUSION BARRIER LAYERS

CROSS REFERENCE TO RELATED APPLICATIONS

This is a divisional application of application Ser. No. 09/685,586, filed Oct. 11, 2000, now U.S. Pat. No. 6,759,703 which is hereby incorporated by reference in its entirety for all purposes.

BACKGROUND OF THE INVENTION

1. Field of the Invention

The present invention relates to a capacitor with excellent high-frequency characteristics, in which a couple of electrodes having a dielectric between them are made of a metal material, and more particularly relates to a structure of a capacitor suitable for mounting in an integrated circuit and a process for manufacturing this capacitor.

2. Description of Related Arts

As one of prior arts for speeding up the operation of an integrated circuit, which uses a unipolar transistor, such as a MOS transistor, or a bipolar transistor, the so-called copper wiring technology is well known which uses copper with lower electric resistance than aluminum to build circuit wiring previously formed by aluminum.

Regarding the capacitor used in an integrated circuit, it is known that a MIM (Metal-Insulator-Metal) capacitor is superior in high-frequency characteristics and more advantageous for improving the high-speed operation properties of the circuit than the so-called PIP (Polysilicon-Insulator-Polysilicon) capacitor in which a couple of electrodes having a dielectric between them are made of a conductive polysilicon.

It is also well known that it becomes possible to further improve the high-frequency characteristics of the integrated circuit by combining the above-mentioned copper wiring technology and technology for forming the electrodes of the MIM capacitor not by aluminum but by a copper metal material with lower electric resistance than aluminum.

However, the use of copper for the electrodes of the MIM capacitor as mentioned above gives rise to a phenomenon that part of the copper atoms constituting the electrodes diffuse into the dielectric made of silicon oxide, for example, between the electrodes of the capacitor. The diffusion of copper atoms into the dielectric deteriorates the insulation characteristics of the dielectric, and therefore decreases the dielectric property and the durability of the capacitor.

Furthermore, in shaping of the copper electrodes, it has been impossible to apply etching technology, which is used on the aluminum electrode, and therefore it has been difficult to form the copper electrodes in desired shape.

SUMMARY OF THE INVENTION

To solve the above problems, the present invention adopts the following configurations.

According to a first aspect of a capacitor of the present invention, the capacitor having a couple of electrodes with a dielectric placed therebetween, at least one of the couple of electrodes being made of copper, wherein the one electrode and the dielectric, a barrier is provided to prevent diffusion of copper into the dielectric.

The dielectric may be made of silicon oxide and the barrier may preferably be made of a conductive nitrided metal material, such as TaN or TiN.

The barrier effectively prevents the diffusion of copper atoms from the copper electrode into the dielectric, and therefore prevents the pollution of the dielectric by the copper electrode and effectively prevents a decrease in the insulating properties of the dielectric by the pollution mentioned above.

The conductive barrier securely prevents the pollution by copper without incurring a substantial increase in thickness of the dielectric of the capacitor, and hence without giving rise to unnecessary and harmful changes in capacity of the capacitor.

According to a second aspect of the present invention, a process for manufacturing a capacitor, wherein the capacitor has a couple of electrodes with a dielectric placed therebetween and at least one of the electrodes is made of copper and the capacitor is formed on a semiconductor substrate, comprises forming a nitrided metal film of a shape corresponding to a desired shape of the one electrode on the semiconductor substrate or the dielectric, and forming the one electrode on the nitrided metal film by electroplating using the nitrided metal film as the seed.

When the one electrode is used as the lower electrode, the nitrided metal film may be formed on the semiconductor substrate, the one electrode as the lower electrode may be formed on the nitrided metal film, a nitrided metal film to function as the barrier is formed on the lower electrode, the dielectric may be formed on the nitrided metal film, and the other electrode as the upper electrode may be formed on the dielectric.

When one electrode is used as the upper electrode, the nitrided metal film may be formed on the dielectric formed on the lower electrode, and the one electrode may be formed on the nitrided metal film on the dielectric.

Whether the one electrode is used for the lower electrode or the upper electrode, this electrode is formed by electroplating using the underlying nitrided metal film as the seed. Therefore, after the nitrided metal layer is formed and etched so as to have a desired pattern by photolithography and etching, the one electrode mentioned above may be formed by electroplating using the nitrided metal film as the seed. In this manner, the one electrode of a desired pattern may be formed relatively easily.

When the one electrode is used as the upper electrode, the nitrided metal film intervening between the upper electrode and the dielectric functions as the barrier to the diffusion of copper. Consequently, the nitrided metal film effectively prevents the diffusion of copper atoms from the upper electrode into the dielectric.

DESCRIPTION OF PREFERRED EMBODIMENTS

Preferred embodiments of the present invention will be described in detail with reference to the accompanying drawings.

<Embodiment 1>

Figure 1:
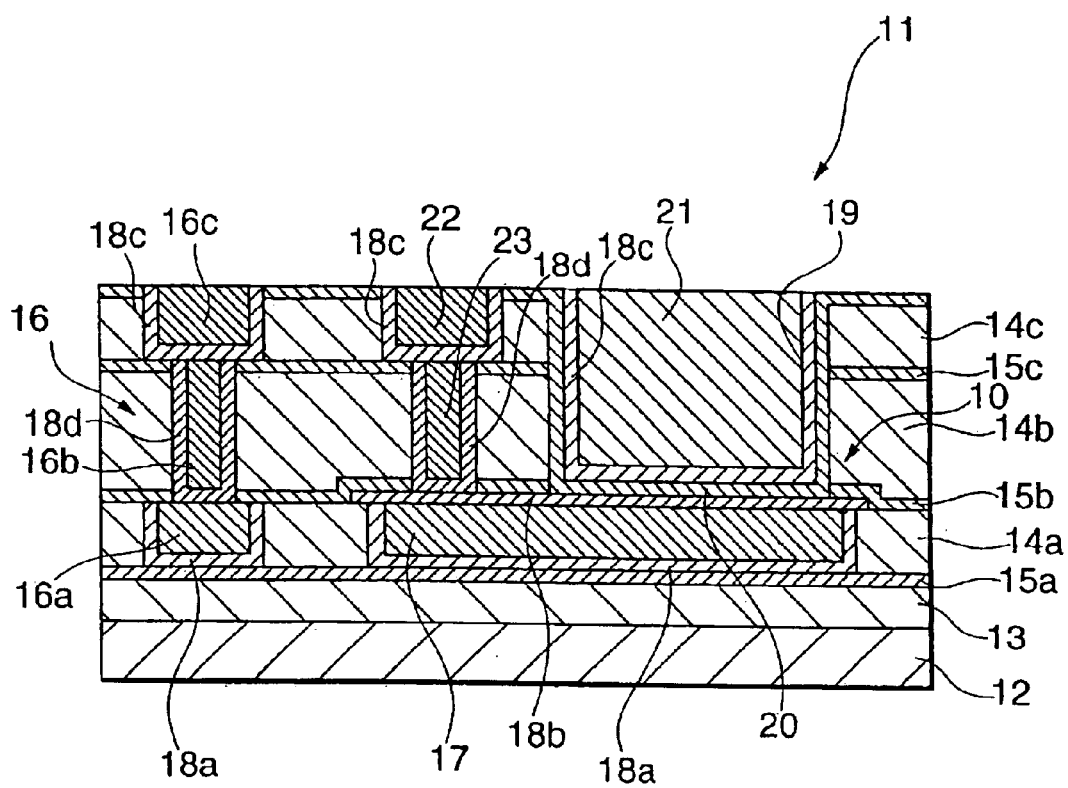
FIG. 1 is a longitudinal section of a capacitor according to a first embodiment of the present invention.

FIG. 1 is a sectional view showing a part of an integrated circuit, which incorporates a capacitor according to the present invention.

An integrated circuit 11 incorporating a capacitor 10 according to the present invention is formed on a semiconductor substrate 12 of silicon, for example. As is the case with conventional integrated circuits, though this is not shown, active elements, including a unipolar transistor, such as a MOS transistor, or a bipolar transistor, are formed in the active region of the semiconductor substrate 12.

As has been well known, an interlayer insulating film 13 made of $SiO_2$ or SiOF, for example, or a so-called low dielectric film, which shows a much lower dielectric constant than $SiO_2$ or the like, is formed to cover a circuit portion including the active element formed on the semiconductor substrate 12.

In addition, on this interlayer insulating film 13, an interlayer insulating film 14 (14a, 14b and 14c) for multi-level interconnection are formed, and in the interlayer insulating film 14, a capacitor 10 according to the present invention is formed.

The interlayer insulating film 14 is formed of the same material as in the interlayer insulating film 13. In the example in FIG. 1, to form the capacitor 10 in the interlayer insulating film 14 by the damascene process, which will be described later, the interlayer insulating film 14 has a lower film 14a, an intermediate film 14b and an upper film 14c stacked on the interlayer insulating film 13, each formed by placing a SiN film 15 (15a, 15b and 15c) between the insulating films.

In the example in FIG. 1, wiring 16 for the circuit portion is formed in the interlayer insulating film 14 in the vicinity of the region where the capacitor 10 is formed.

Further formed in the lower insulating layer 14a of the interlayer insulating film 14 are a lower copper electrode 17 of the capacitor 10 and a lower copper pattern 16a of the wiring 16. The lower electrode 17 and the lower wiring pattern 16a are covered on their bottom faces and circumferential surfaces with a barrier layer 18a to prevent their contact with the lower layer 14a of the interlayer insulating film 14.

The barrier layer, or the barrier 18a is formed of a nitrided metal material, such as a TiN material or TaN material, which has conductivity and prevents the diffusion of the copper material into the lower insulating layer 14a. The barrier 18a to prevent the diffusion of the copper material may be formed of a SiN material, which is non-conductive, instead of the conductive TiN or TaN material.

The top surface of the lower electrode 17 is covered with a barrier layer 18b of the same material as the barrier layer 18a. Thus, the lower electrode 17 is covered on all surfaces with the conductive barriers 18a and 18b, and is prevented from directly contacting the interlayer insulating film 14.

An etching stopper film, in other words, a SiN film 15b on the lower layer 14a of the interlayer insulating film 14 is formed to cover the barrier 18b extending on the top surface of the lower electrode 17. Formed passing through this SiN film 15b and the SiN film 15c and the layers 14b and 14c of the interlayer insulating film 14 is a recess 19, in which a dielectric 20 is formed.

The dielectric 20 is formed of an insulting film of $SiO_2$ or SiN. In the example in FIG. 1, the insulating film that forms the dielectric 20 extends from the barrier 18b, which defines the bottom face of the recess 19, and rises upward to cover the circumferential wall of the recess 19 and to also cover the top surface of the upper layer 14c of the interlayer insulating film 14.

The upper electrode 21 is accommodated in the recess 19. The upper electrode 21 pinches the dielectric 20 in cooperation with the lower electrode 17, thereby forming a capacitor 10. The upper electrode 21 accommodated in the recess 19 is covered on its circumferential surface and bottom surface with a barrier layer 18c that is the same as was mentioned above, except for the top surface exposed from the top end of the upper insulating layer 14c. The top surface of the upper electrode 21 exposed from the top end of the insulating layer 14c serves as the connection terminal of the upper electrode 21.

In the vicinity of the connection terminal of the upper electrode 21, a copper wiring pattern 22 for the lower electrode 17 is arranged in the upper insulating layer 14c with its top surface exposed at the top ends of the upper insulating layer 14c and the dielectric 20. The copper wiring pattern 22 is covered on its surfaces, excluding the top surface, with the barrier 18c, which is the same as the one mentioned above, to prevent copper atoms from diffusing, thus making it possible to prevent a contact between the wiring pattern 22 and the upper insulating layer 14. The wiring pattern 22 is connected to the lower electrode 17 through a stud 23 passing through the SiN film 15c, the intermediate insulating layer 14b and the SiN film 15b.

In the example shown in FIG. 1, the stud 23 is made of tungsten W (hereafter often referred to as W) and is covered on all surfaces, except for the top surface, with a nitrided metal layer 18d similar to the above-mentioned barriers 18a and 18b. The nitrided metal layer between the stud 23 and the intermediate insulating layer 14b functions to strengthen the bonding between the stud 23 made of W and the intermediate insulating layer 14b.

The lower wiring pattern 16a of the wiring 16 passes through the stud 16b made of tungsten and covered with the same nitrided metal layer 18d as in the stud 23, and is connected to the upper wiring copper pattern 16c covered on all surfaces, except for the top surface, with the same barrier 18c of copper as mentioned above.

In the integrated circuit, he barriers 18a, 18b and 18c made of TiN material for preventing the diffusion of copper atoms into the interlayer insulating film 14 are provided between the interlayer insulating film 14 and the copper components of the capacitor 10: the lower electrode 17, the upper electrode 21 and the wiring pattern 22. Furthermore, the barriers 18a and 18c made of TiN material for preventing the diffusion of copper atoms into the interlayer insulating film 14 are provided between the interlayer insulating film 14 and the copper patterns of the wiring 16: the lower wiring pattern 16a and the upper wiring pattern 16c.

The barrier 18 (18a, 18b and 18c) prevents copper atoms from diffusing into the interlayer insulating film 14 and the dielectric 20, thus preventing the deterioration of the insulating properties of the insulating films 14 and 20, which would otherwise result from the diffusion. Therefore, it becomes possible to form the circuit components by copper material superior in conductivity without incurring the deterioration in the insulating properties of the insulating films 14 and 20, thereby improving the high-frequency characteristics of the integrated circuit.

With regard to the capacitor 10, copper atoms can be securely prevented from diffusing into the dielectric 20 by having the barrier 18 (18b and 18c) intervene between the two copper electrodes 17 and 21 and the dielectric 20, and the dielectric 20 can be prevented from deteriorating in insulating properties, which would be caused by the diffusion, so that the insulating properties of the dielectric 20 can be maintained.

Therefore, the high-frequency characteristics of the capacitor 10 can be suitably improved and maintained without incurring changes in capacity, which would, in the prior art, arise from a decrease in the insulating properties of the dielectric 20 of the capacitor 10. For this reason, it is possible to make good use of the advantage of using copper for the upper and the lower electrodes 17 and 20.

The above-mentioned non-conductive material may be used for the barriers 18b and 18c, which intervene between the upper electrode 21 and the lower electrode 17. However, the use of the barriers of non-conductive material causes a substantial change in the thickness of the dielectric 20, which gives rise to a capacity change of the capacitor 10 attributable to variations of the barrier thickness.

In contrast, as shown in the first embodiment, when conductive barriers 18b and 18c are used, the capacitor 10 xn be provided with a specified capacity based on the initially set thickness of the dielectric 20 regardless of variations of the barrier thickness.

By referring to FIG. 2, description will be made of the manufacturing process of the capacitor 10 shown in FIG. 1. In FIG. 2, the semiconductor substrate 12 is omitted for simplicity of the drawing.

FIGS. 2(a) to 2(e) show the steps for forming a buried capacitor 10 by using the so-called damascene process.

Figure 2A:
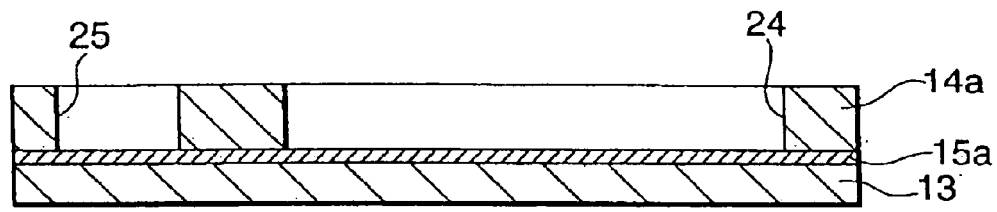
FIG. 2(a)–FIG. 2(e) show the manufacturing process of the capacitor shown in FIG. 1.

As shown in FIG. 2(a), an interlayer insulating film 13 is formed on the semiconductor substrate 12 (not shown), and a SiN film 15a to serve as an etching stopper film is formed on the interlayer insulating film. Though this is not shown, a through-hole leading to the circuit portion under the interlayer insulating film 13 is formed, when necessary, in the SiN film 15a and the interlayer insulating film 13.

Thereafter, a lower layer 14a of the interlayer insulating film 14 is formed, and the lower insulating portion 14a is etched by a well-known photolithographic etching technique using resist patterns (not shown on the layer 14a) and etching to form a recess 24 and a trench 25 for the lower electrode 17 and the lower wiring pattern 16a. In etching of the lower insulating portion 14a for the recess 24 and the trench 25, because the SiN film acts as an etching stopper film, the interlayer insulating film 13 under the SiN film 15a is protected from the etching process.

Figure 2B:
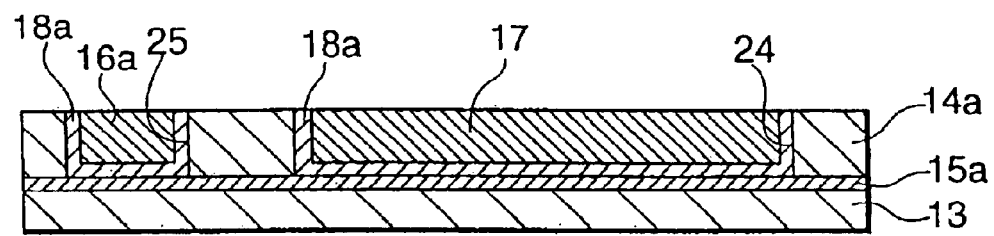

TiN or TaN, which is a conductive material as mentioned above, is deposited on all surfaces, including the surfaces of the recess 24 and the trench and the surfaces of the lower insulating film 14a by sputtering. The deposited material is removed from the surface of the lower insulating layer where it is not required, with the result that a barrier layer 18a is formed on the walls of the recess 24 and the trench 25 as shown in FIG. 2(b).

The barrier layer 18a is made of a conductive material as described above, and by electroplating using this conductive material as the seed layer, a copper material is deposited in the recess 24 and the trench 25, which are gradually filled with copper. The unwanted portion of the copper material protruding from the surface of the lower insulating layer 14a is removed by chemical mechanical polishing (CMP), and the lower electrode 17 and the lower wiring pattern 16a are formed in the recess 24 and the trench 25 with interposition of the barrier layer 18a as shown in FIG. 2(b).

Figure 2C:
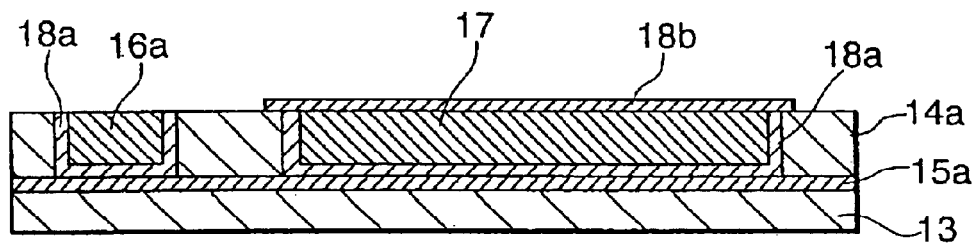

For example, a TiN film for the barrier layer 18b is deposited by sputtering, for example, on surface of the lower insulating layer 14a, which includes the lower electrode 17 in the recess 24 and the lower wiring pattern 16a in the trench 25. An unwanted portion of the deposited film, which protrudes to a great extent from the lower electrode 17 in the recess 24 by etching using resist patterns, not shown, and then a barrier 18b is formed covering the exposed top surface of the lower electrode 17 as shown in FIG. 2(c).

Therefore; the two barriers 18a and 18b jointly cover the whole surfaces of the lower electrode 17.

Figure 2D:
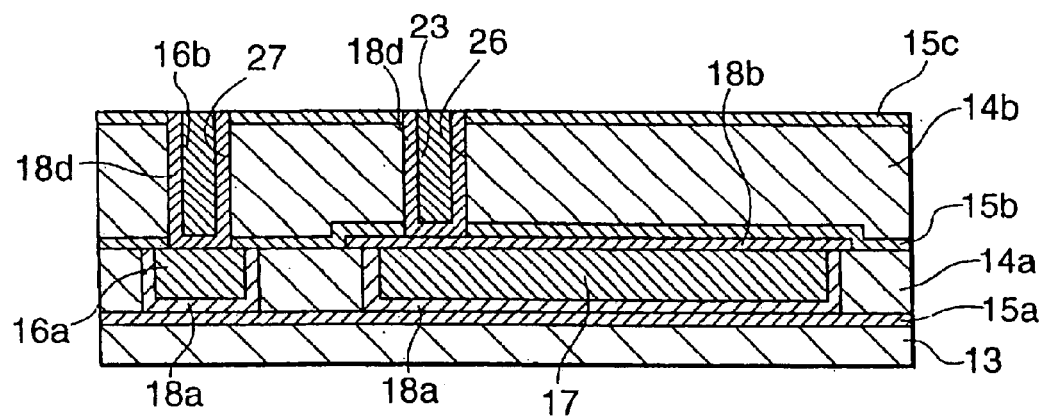

Referring to FIG. 2(d), a SiN film 15b just like the SiN film 15a is formed on the surfaces of the lower insulating layer 14a, the barrier 18b and the lower wiring pattern 16a, and an intermediate insulating layer 14b is deposited on the SiN film 15b. A stepped portion is formed, which corresponds to the peripheral edge portion of the barrier 18b, on the top surface of the intermediate insulating layer 14b, but it is removed by a well-known flattening process. Thus, the top surface of the intermediate insulating layer 14b is made flat as shown in FIG. 2(d). A SiN film 15c is formed on the top surface of the flat intermediate insulating layer 14b.

Subsequently, through-holes 26 and 27 are formed by a well-known etching process using resist patterns. The through-holes 26 and 27 pass through the SiN film 15c, the intermediate insulating layer 14b and the SiN film 15b and the hole 26 leads to the barrier 18b on the lower electrode 17 while the hole 27 leads to the lower wiring pattern 16a.

By using a sputtering method that is the same as was used in forming the barrier 18a on the walls of the recess 24 and the trench 25, a nitrided metal layer 18d, such as a TiN film, is formed on the walls of the through-holes 26 and 27 and on the SiN film 15c. A tungsten (W) film is grown on the nitrided metal layer 18d by CVD. The unwanted portions of the nitrided metal layer and tungsten layer, which protrude from the through-holes 26 and 27 are removed, with the result that the studs 16b and 23 are formed. The nitrided metal layer 18d acts to reinforce the bonding strength of the tungsten of the studs. 16b and 23 to the intermediate insulating layer 14b and the lower wiring pattern 16a.

Figure 2E:
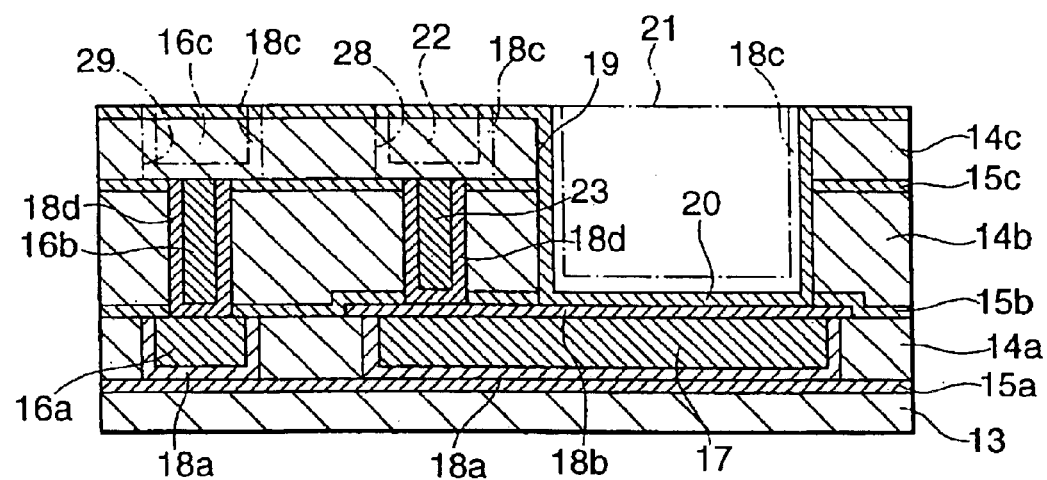

An upper layer 14c of the interlayer insulating film 14 is formed on the exposed surface of the SiN film 15c that appears after the above-mentioned removal of the unwanted portions of the nitrided metal layer and tungsten as shown in FIG. 2(e). After this, a recess 19 is formed through the upper and lower insulating layers 14c and 14b, which partially exposes the barrier 18b by selective etching using the resist patterns (not shown) as the etching mask in the same manner as was mentioned before.

An insulating film 20, such as $SiO_2$ or SiN, for the dielectric is formed by CVD on the wall of the recess 19 and on the top surface of the upper insulating layer 14c.

After this, as shown in FIG. 2(e), the upper insulating layer 14c is etched by photolithography and etching in the same manner as mentioned above, to create trenches 28 and 0.29 for the wiring pattern 22 and the upper wiring pattern 16c, respectively. A nitrided metal film 18c is formed by sputtering in the same manner as mentioned above on the walls of the recess 19 and the trenches 28 and 29. By electroplating using the nitrided metal film 18c as the seed layer, copper is deposited in the recess 19 and the trenches 28 and 29, and an excess portion of the copper is removed by CMP. In this manner, the upper electrode 21, the wiring pattern 22 and the upper wiring pattern 16c all made of copper are formed and as the result, the integrated circuit 11 shown in FIG. 1 is completed.

By using a conductive metal, such as a nitrided metal film, for the barrier 18 (18a to 18c), which prevents the pollution by diffusion of copper atoms as mentioned above, it is possible to prevent the capacitor 10 from changing in the capacity due to a thickness variation of the barrier 18 (18b and 18c). Furthermore, when the barrier 18 (18a to 18c) is formed by a conductive metal, this barrier 18 can be used as the seed layer in electroplating to form the copper electrode 17 and the copper wiring pattern 16a as mentioned above, which makes for the improvement of production efficiency.

Therefore, by using the manufacturing process shown in FIG. 2, an integrated circuit 11, which includes a capacitor 10 shown in FIG. 1, can be manufactured efficiently.

<Embodiment 2>

Figure 3:
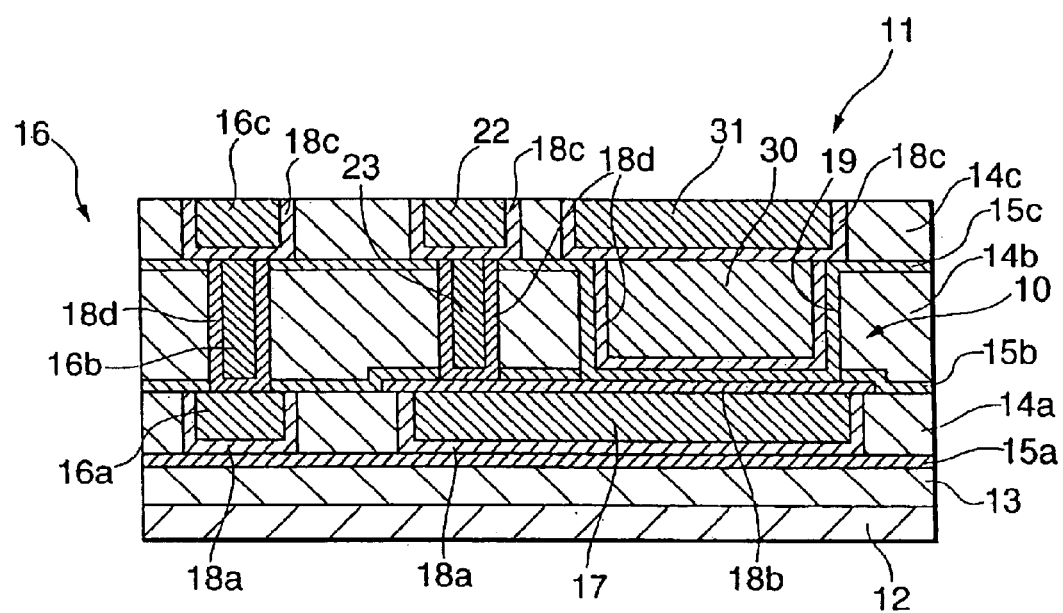
FIG. 3 is a longitudinal section of a capacitor according to a second embodiment of the present invention.

FIG. 3 resembles the drawing in FIG. 1, but shows the second embodiment of the capacitor according to the present invention.

In the capacitor in the second embodiment, an upper electrode 30 made of tungsten is used instead of the upper electrode 21 in the first embodiment. As the dielectric, a SiN film 15c is used, which serves as an etching stopper.

A recess 19 for the upper electrode 30 is formed in the intermediate layer of the interlayer insulating film 14. The SiN film 15c, which covers the upper surface of the intermediate insulating layer 14b, extends to cover the wall of the recess 19.

The upper tungsten electrode 30 is accommodated in the recess 19 covered with the SiN film 15c with interposition of the nitrided metal layer 18d, which has conductivity as mentioned above.

The upper electrode 30 forms a capacitor 10 in cooperation with the lower electrode 17 and the SiN film, which is a dielectric film and located between the upper electrode 30 and the lower electrode 17.

The nitrided metal layer 18d covering the upper electrode 30 strengthens the bonding between the upper tungsten electrode 30 and the SiN film 15c. A wiring pattern 31 for the upper electrode 30, located over the upper electrode 30, is provided in the upper insulating layer 14c and exposed from the opening of the upper layer 14c of the interlayer insulating film 14. The wiring pattern 31 is formed of a copper material. As with the wiring pattern 22 for the lower electrode 17 and the upper wiring pattern 16c of the wiring 16, a barrier 18c for preventing the diffusion of copper atoms from the wiring pattern 31 into the upper insulating layer 14c is provided between the wiring pattern 31 and the upper insulating layer 14c.

Because the lower electrode 17 made of copper is covered with the barriers 18a and 18b as in the first embodiment shown in FIG. 1, copper atoms are surely prevented from diffusing into the lower insulating layer 14a and the SiN film 15c.

Therefore, the capacitor electrode 17 and the wiring patterns 22 and 31 can be formed of copper superior in conductivity without incurring the deterioration in insulating properties caused by copper atoms being diffused into the interlayer insulating film 14, making it possible to improve the high-frequency characteristics of the integrated circuit.

FIG. 4 shows the manufacturing process of the capacitor 10, shown in FIG. 3, by using the damascene process that is the same as used in FIG. 2. In FIG. 4, as in FIG. 3, the semiconductor substrate 12 is omitted.

Figure 4A:
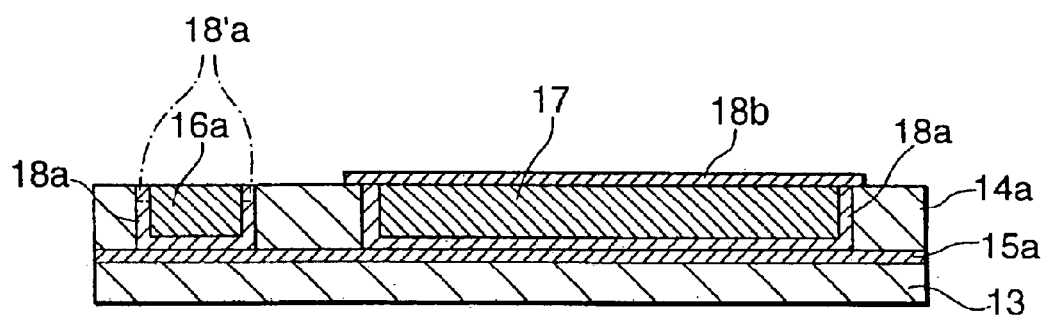
FIG. 4(a)–FIG. 4(d) show the manufacturing process of the capacitor shown in FIG. 3.

In FIG. 4(a), as shown in FIG. 2(c), a lower layer 14a of the interlayer insulating film 14 is deposited on the SiN film 15a on the interlayer insulating film 13. The lower electrode 17 and the lower wiring pattern 16a, both made of copper, are embedded in the lower insulating layer 14a with interposition of the barrier 18a by carrying out the same procedure as described with reference to FIG. 2. In addition, a barrier 18b is formed to cover the exposed lower electrode 17.

Figure 4B:
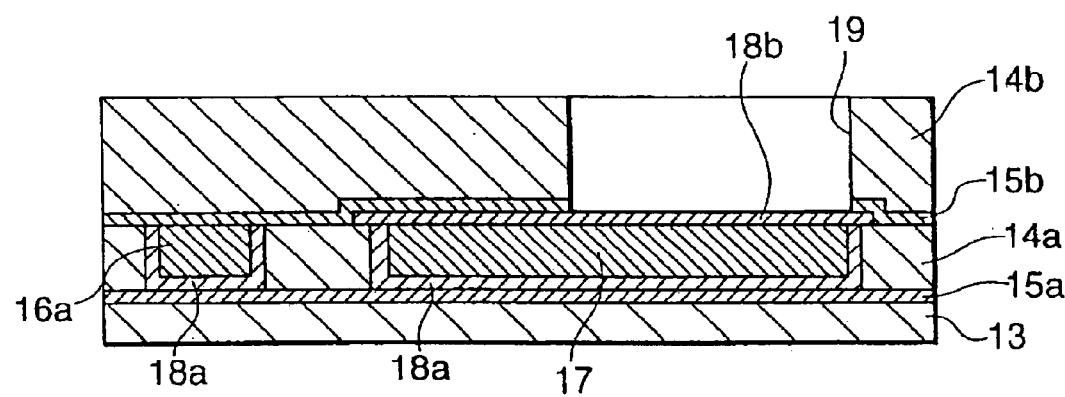

As shown in FIG. 4(b), after the barrier 18b is formed, a SiN film 15b is formed to cover the exposed surfaces of the barrier 18b and the lower insulating layer 14a, and an intermediate layer 14b of the interlayer insulating film 14 is deposited on the SiN film 15b.

The intermediate insulating layer 14b is etched by selective etching using a photolithographically-formed resist pattern (not shown) as a mask to create a recess 19 which is open at the top surface of the barrier 18b on the lower electrode 17.

Figure 4C:
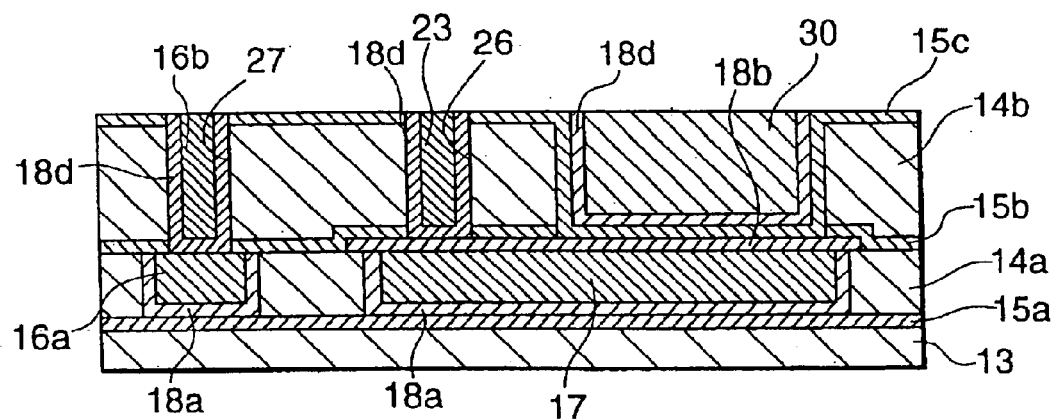

After the recess 19 is formed, as shown in FIG. 4(c), a SiN film 15c, which partly serves as the dielectric and functions as the etching stopper, is formed by CVD to cover the wall of recess 19 and the top surface of the intermediate insulating layer 14b.

Subsequently, the through-holes 26 and 27 are formed by following the same procedure as has been described with reference to FIG. 2(d). Also by following the same procedure as was used in forming the nitrided metal layer 18d and filling tungsten in the through-holes 26 and 27 and in the recess 19, and then tungsten is filled over the nitrided metal layer. Thus, the upper electrode 30 is formed in the recess 19 and is strongly bonded to the intermediate insulating layer 14b with interposition of the nitrided metal layer 18d. The studs 23 and 16b, which are the same as in FIG. 2(d), are formed in the through-holes 26 and 27.

Figure 4D:
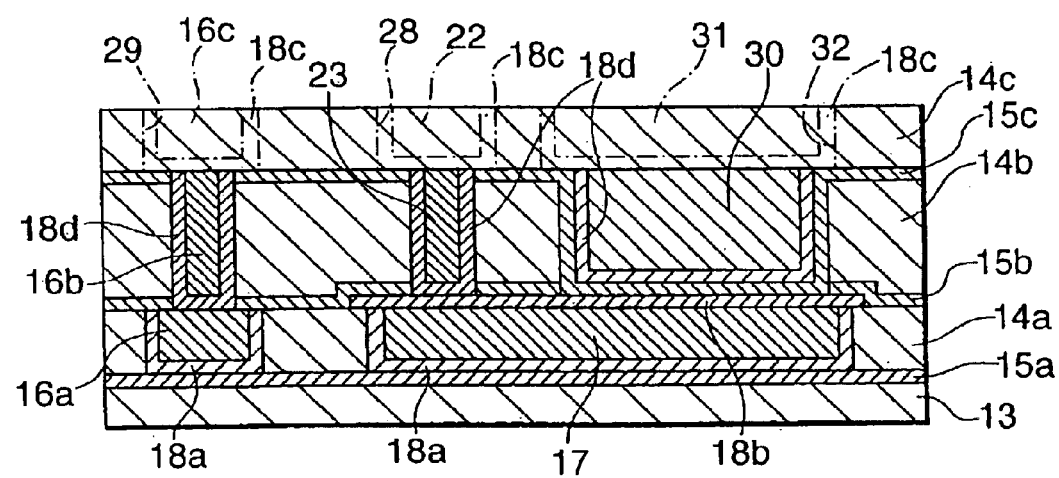

After the upper electrode 30 and the studs 16b and 23 are formed in the intermediate insulating layer 14b and the top surface of the SiN film 15c is made flat by the flattening process, and as shown in FIG. 4(d), an upper insulating layer 14c is formed to bury the upper electrode 30 and the studs 16b and 23.

The upper insulating layer 14c is etched by photolithography and etching in the same manner as mentioned above to form trenches 32, 28 and 29 to accommodate wiring patterns 31, 22 and 16c, respectively. By following the procedure for forming the wiring patterns 22 and 16c in the first embodiment, a barrier 18d made of a nitrided metal layer is formed on the walls of the trenches 32, 28 and 29, and by performing electroplating using the barrier 18d as the seed layer, the wiring patterns 31 and 22 and the upper wiring pattern 16c are formed.

According to the process shown in FIG. 4, the barrier for preventing the decrease in insulating properties of the insulating film caused by copper metal can be utilized as the seed layer in copper plating, so that it is possible to efficiently form an integrated circuit 11, including a capacitor 10 shown in FIG. 3, which is excellent in high-frequency characteristics and which has a wiring pattern 31 above the upper electrode 30, without incurring the deterioration of the insulating film caused by copper metal.

<Embodiment 3>

Figure 5:
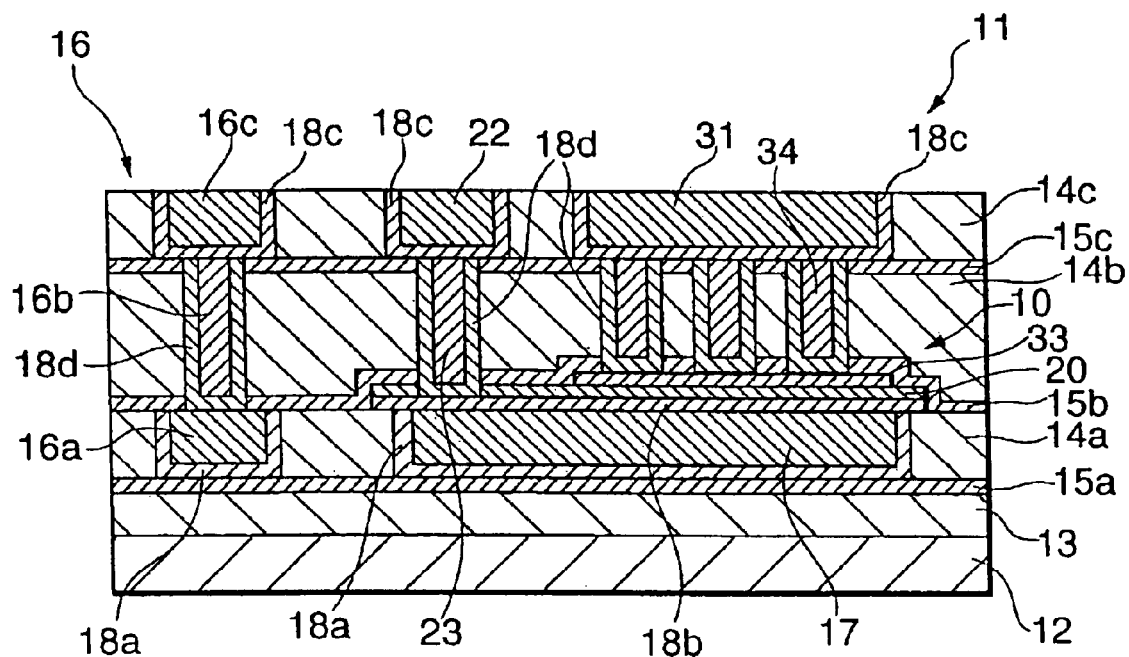
FIG. 5 is a longitudinal section of a capacitor according to a third embodiment of the present invention.

FIG. 5 shows an example in which the upper electrode is formed by a nitrided metal film.

In the capacitor 10 in the third embodiment shown in FIG. 5, instead of the upper electrode 30 of tungsten as shown in the second embodiment, an upper electrode 33 of a nitrided metal showing conductivity, such as a TiN film, is used. The upper electrode 33 made of a nitrided metal is higher in electric resistance than tungsten or copper mentioned above, and to reduce the resistance, a plurality of studs 34 are provided between the upper electrode 33 and the wiring pattern 31.

The studs 34, being made of tungsten, is covered on their surfaces with a nitrided metal layer 18d to increase the bonding strength to the interlayer insulating film 14 as mentioned above. An insulating film, such as $SiO_2$ or SiN, is used for the dielectric 20 between the upper and lower electrodes 17 and 33 as in the first embodiment. The other functional parts identical with those in FIG. 3 are designated by the same reference numerals as in FIG. 3.

FIG. 6 shows the manufacturing process of the capacitor 10, shown in FIG. 5, by using the same damascene process as mentioned above. In FIG. 6, the semiconductor substrate 12 is omitted.

A lower insulating layer 14a is deposited on the SiN film 15a as the etching stopper on the interlayer insulating film 13. The lower electrode 17 and the lower wiring pattern 16a, both of copper, are embedded in the lower insulating layer 14a with interposition of the barrier 18a by the same procedure as has been described referring to the second embodiment. The flattening process is carried out on the top surface of the upper insulating layer 14a in which the lower electrode 17 and the lower wiring pattern 16a have been embedded.

Figure 6A:
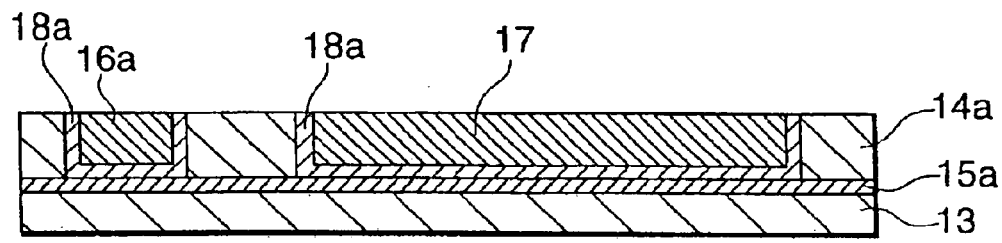
FIG. 6(a)–FIG. 6(e) show the manufacturing process of the capacitor shown in FIG. 6.
Figure 6B:
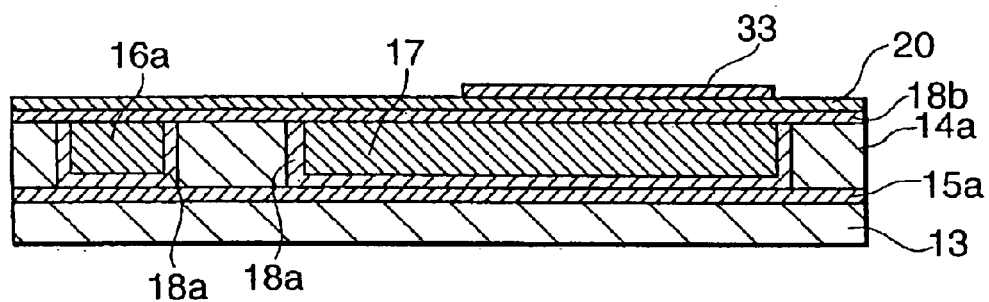

As shown in FIG. 6(b), a nitrided metal layer for the barrier 18b is formed by sputtering on the top surface of the flattened lower insulating layer 14a. Moreover, the above-mentioned insulating film to serve as the dielectric 20 is formed on the nitrided metal layer 18d by CVD. Being formed on the flat barrier layer 18b, the insulating film (20) becomes a flat plate with a substantially uniform thickness.

After a TiN film (33) to serve as the upper electrode 33 is formed on the insulating film (20) by sputtering, the unnecessary portion of the TiN film is removed by photolithography to obtain an etching mask and selective etching using this etching mask in the same manner as mentioned above. Thus, the upper electrode 33 is formed on the dielectric 20.

Figure 6C:
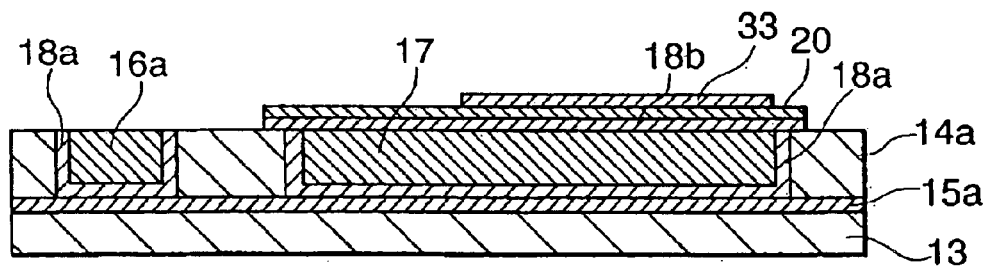

Then, the unnecessary portions of the dielectric 20 and the barrier 18b under the upper electrode 33 are removed by photolithography and selective etching in the same manner as described previously, with the result that the lower wiring pattern 16a is exposed at the top end of the lower insulating layer 14a as shown in FIG. 6(c).

Figure 6D:
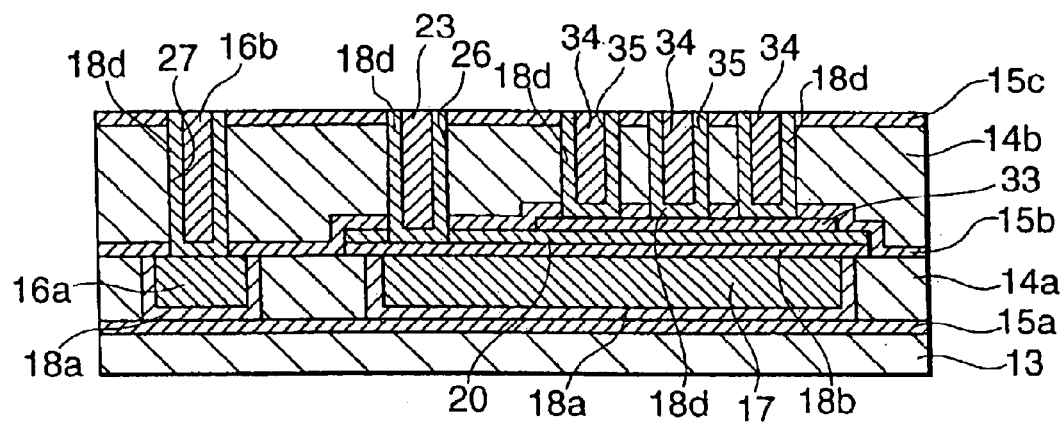

Subsequently, as shown in FIG. 6(d), the SiN film 15b to serve as the etching stopper and the intermediate insulating layer 14b are deposited, and after a flattening process is carried out on the top surface of the intermediate insulating layer 14b, a SiN film 15c is formed, which is the same as the one mentioned above.

By photolithography and etching in the same manner as described previously, through-holes 35, 26 and 27 are formed to accommodate the studs 34, 23 and 16b, which pass through the SiN film 15 and the intermediate insulating layer 14b.

A nitrided metal layer 18d is formed by sputtering on the walls of the through-holes 35, 26 and 27, and tungsten is deposited on the nitrided metal layer by CVD. By removing excess portions of those layers, the studs 34, 23 and 16b, covered with the nitrided metal layer that increases the bonding strength as mentioned above, are formed in the through-holes 35, 26 and 27.

Figure 6E:
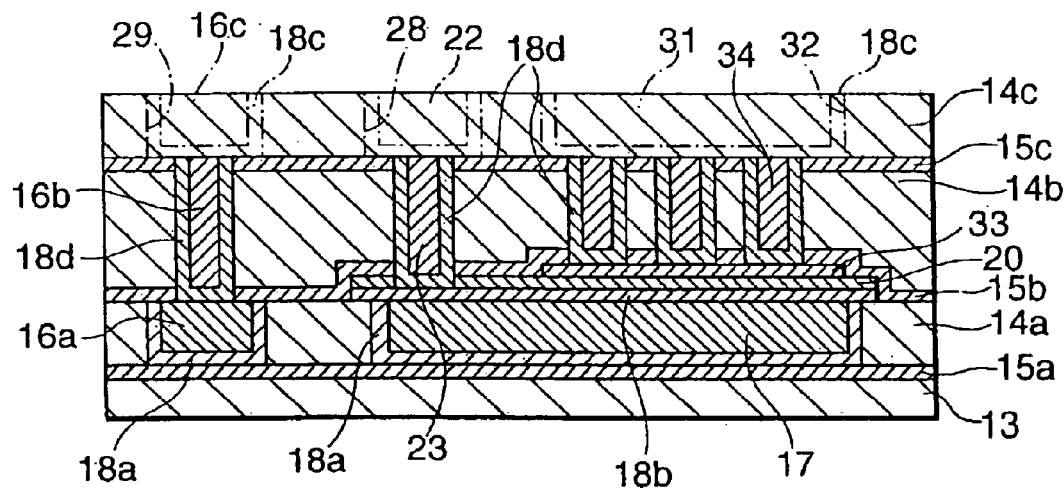

As shown in FIG. 6(e), an upper insulating layer 14c, in which the studs 34, 23 and 16b are buried, is formed on the SiN film 15c.

The upper insulating layer 14c is etched by photolithography and etching in the same manner as described above, to form trenches 32, 28 and 29 to accommodate the wiring patterns 31 and 22 and the upper wiring pattern 16c. Then, by following the same procedure as in the second embodiment, a barrier 18d made of a nitrided metal layer is formed on the walls of the trenches 32, 28 and 29, and by electroplating using this barrier 18d as the seed layer, the wiring patterns 31 and 32 and the upper wiring pattern 16c are formed.

In the capacitor 10 in the third embodiment, which has the upper electrode 33 made of a conductive nitrided metal layer, such as a TiN film, to reduce the high resistance of the upper electrode 33, the area of the wiring pattern 31 should preferably be made equal to or larger than that of the upper electrode 33.

According to the method shown in FIG. 4, as in the second embodiment, because the barrier that prevents the deterioration of the insulating films caused by copper metal can be utilized as the seed layer in copper plating, an integrated circuit 11 excellent in high-frequency characteristics and having the wiring pattern 31 provided on the upper electrode can be formed efficiently without incurring the deterioration of the insulating film ascribable to the diffusion of copper atoms.

Further, in the first and second embodiments, the dielectric 15c or 20 has its peripheral portion rising along the outer periphery of the upper electrode 21 or 30. In the third embodiment, on the other hand, the dielectric 20 is formed in a flat plate, without any such rising portion.

When the dielectric is formed with a rising portion, an omission of some portion of it is likely to occur at the angled portion and the thickness tends to be uneven. For this reason, with the dielectric having a rising portion as mentioned above, it is necessary to form the whole body of the dielectric with a relatively large thickness to surely prevent a current leakage at some portion that is missing. As a result, the dielectric in its entirety is formed with an increased thickness, which results in a decrease in the capacity of the capacitor 10.

A solution to this problem is shown in the third embodiment. More specifically, by making the dielectric body in a flat form without any rising portion, the dielectric 20 with a desired thickness can be formed relatively easily without occurrence of any missing portion.

Therefore, the third embodiment is advantageous for forming capacitors 10 with large capacity and high-frequency properties and with uniform characteristics.

<Embodiment 4>

Figure 7:
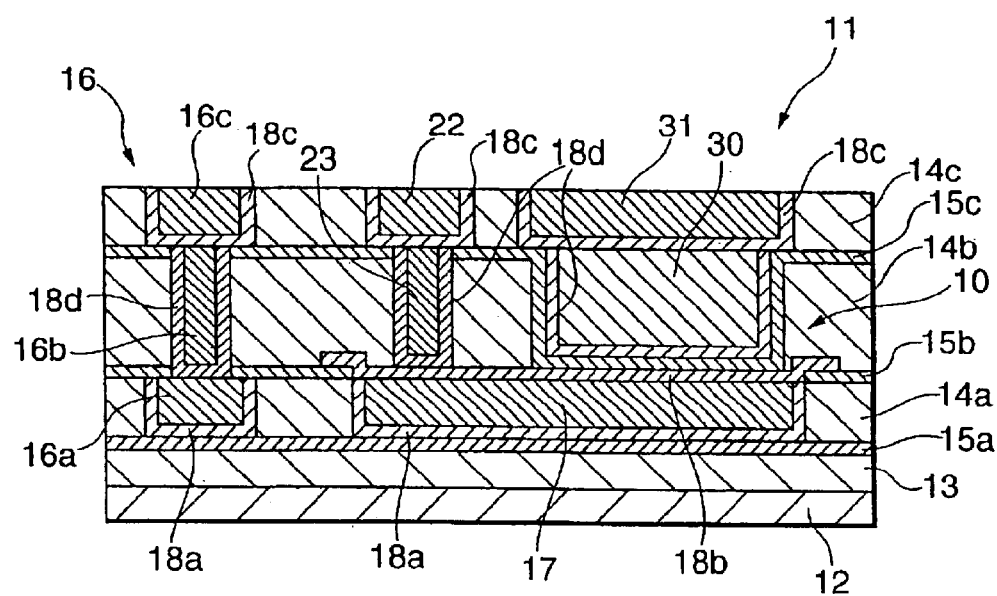
FIG. 7 is a longitudinal section of a capacitor according to a fourth embodiment of the present invention.

In FIG. 7, the capacitor 10 is the same as the capacitor 10 in the second embodiment, except for differences in the barrier 18b and the SiN film 15b.

As shown in FIG. 4(a) showing the manufacturing process of the capacitor 10 of the second embodiment, in the second embodiment, to form the barrier 18b on the lower insulating layer 14a, a nitrided metal layer (18b) is deposited covering all over the top surface of the lower insulating layer 14a, then the nitrided metal layer is patterned by photolithography and etching to remove the unnecessary portions of the nitrided metal layer, so that the barrier layer 18b is formed.

In the second embodiment, when the upper periphery 18' of the barrier 18a, made of the nitrided metal layer surrounding the circumferential wall of the lower wiring pattern 16a, is etched away as shown in FIG. 4(a) by etching in the patterning carried out to form the barrier layer 18, in the subsequent formation of the SiN film 15b, the SiN film 15b with higher electric resistance than the nitrided metal layer 18a enters the recess formed by the etching mentioned above and fills up the recess.

This intrusion of the SiN film 15b results in a substantial increase in the electric resistance of the conductive parts, such as the lower wiring pattern 16a and the barrier layer 18a surrounding the wiring pattern 16a, and also leads to a great increase in the electric resistance in so-called borderless wiring in which the lower wiring pattern 16a and the stud 16b have the same diameter.

Figure 8A:
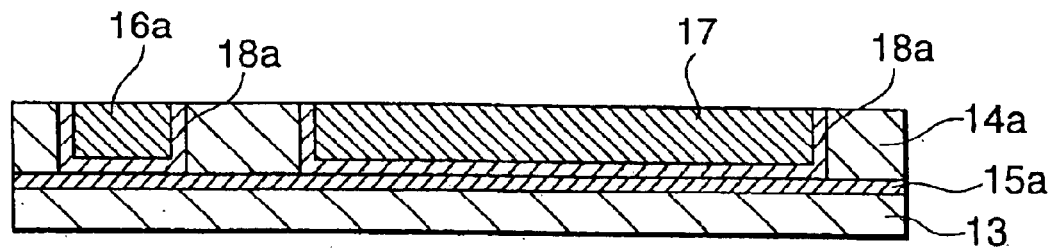
FIG. 8(a)–FIG. 8(c) show the manufacturing process of the capacitor shown in FIG. 7.

On the other hand, in the fourth embodiment, as shown in FIG. 8 depicting the manufacturing process, a lower layer 14a of the interlayer insulating film 14 is deposited on the SiN film 15a as the etching stopper film on the interlayer insulating film 13, and the lower electrode 17 and the lower wiring pattern 16a, both made of copper, are embedded in the lower insulating layer 14a with interposition of the barrier 18a by the same steps as described in the second embodiment. After this, the top surface of the lower insulating layer 14a is subjected to the flattening process.

After the flattening process is finished, a SiN film 15b to serve as the etching stopper film is deposited on the whole surface of the lower insulating film 14a. Therefore, the SiN film 15b does not penetrate into any of the lower insulating layer 14a, the lower wiring pattern 16a and the barrier layer 18a, and the lower wiring pattern 16a and the barrier layer 18b in the lower insulating layer 14a are covered with the SiN film 15b having a flat lower surface.

Figure 8B:
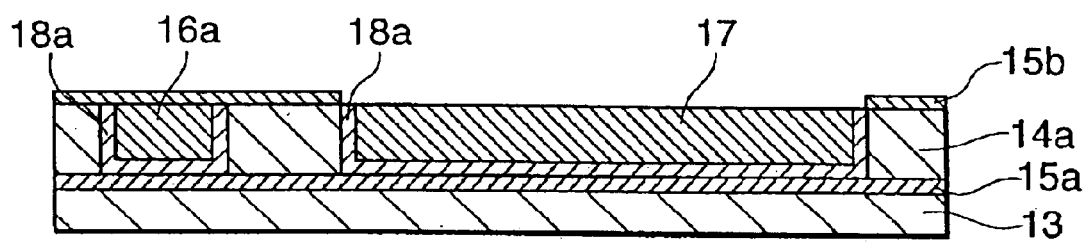
Figure 8C:
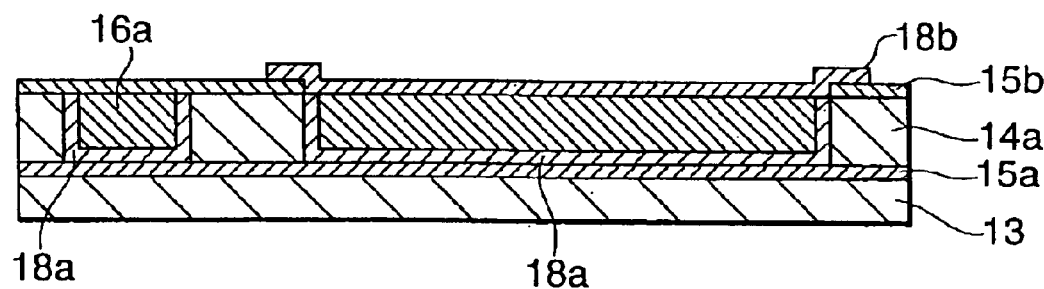

As shown in FIG. 8(b), the SiN film 15b on the lower insulating layer 14a is etched by photolithography and etching is the same manner as descried previously to remove specified portions to expose the lower electrode 17, and a barrier layer 18b is deposited on the exposed lower electrode 17 as shown in FIG. 8(c).

Therefore, the barrier layer 18b is formed with its outer periphery located on the inner periphery of the SiN film 15b.

In the etching of the SiN film 15b, the lower wiring pattern 16a and the barrier 18a surrounding it are placed below the SiN film 15b as shown in FIG. 8(b), for which reason the upper periphery of the barrier layer is never etched away as shown in FIG. 4(a).

As described with reference to the second embodiment, on the SiN film 15b and the barrier layer 18b, an intermediate insulating layer 14b and a SiN film 15c are deposited, then an upper electrode 30 partially covered with a nitrided metal layer 18d and the studs 23 and 16b are formed. After this, an upper insulating layer 14c is formed on the SiN film 15c, and the capacitor 10 is completed by forming wiring patterns 31 and 22 and the upper wiring pattern 16c on the upper insulating layer 14c.

According to the manufacturing process of the capacitor 10 of the fourth embodiment shown in FIG. 8, as described above, it never occurs that the SiN film 15b enters the upper peripheral portion of the barrier layer 18a surrounding the lower wiring pattern 16a, and even if a so-called borderless wiring is adopted in the wiring 16, there is no possibility that a local increase in electric resistance in relation to the lower wiring pattern 16a.

The capacitor 10 according to the present invention can be used in combination with an unipolar transistor, such as a MOS transistor, or a bipolar transistor.

According to the capacitor in the present invention, as described above, the barrier that intervenes between the copper electrode and the dielectric securely prevents copper atoms from diffusing from the copper electrode into the dielectric, which prevents a decrease in electric resistance of the dielectric polluted by copper, and therefore prevents the deterioration of the capacitor by pollution by diffused copper atoms, which makes it possible to improve the durability of the capacitor excellent in high-frequency characteristics.

According to the manufacturing process of the capacitor according to the present invention, as has been described, at least one electrode made of copper is formed by electroplating using the underlying nitrided metal film as the seed, and therefore by forming the nitrided metal film in a desired shape, the electrode can be formed in the desired shape of the nitrided metal film, and it becomes relatively easy to form the capacitor superior in high-frequency characteristics, including a copper electrode of desired shape.

What is claimed is:

1. A capacitor formed on a substrate, having an upper electrode, and a lower electrode interposed between the upper electrode and the substrate, with a dielectric between the upper and lower electrodes, at least the, upper electrode being made of copper, wherein the lower electrode is formed in a first recess that passes through a first insulating layer of an interlayer insulating film, wherein top surfaces of the lower electrode and the first insulating layer are formed along a first plane, the upper electrode and the dielectric are formed in a second recess which passes through a second insulating layer of the interlayer insulating film, a barrier is provided in the second recess to prevent diffusion of copper into the dielectric, the lower electrode does not extend into the second recess, and the dielectric extends out of the second recess on a top surface of the second insulating layer, and wherein a top surface of the dielectric on the second insulating layer and a top surface of the upper electrode are coplanar.

2. A capacitor according to claim 1, wherein the lower electrode is also made of copper, wherein a second barrier is provided at the top surface of the lower electrode to prevent diffusion of copper into the dielectric.

3. A capacitor according to claim 2, wherein the second barrier on the top surface of the lower electrode is a conductive barrier, and wherein bottom and circumferential surfaces of the lower electrode have non-conducting barriers thereon.

4. A capacitor according to claim 3, wherein the dielectric is made of silicon oxide and the conductive barrier and the non-conducting barriers are respectively made of nitrified metal material and nitrified non-metal material.

5. A capacitor according to claim 4, wherein the nitrified metal material and the nitrified non-metal material are respectively TaN and SiN.

6. A capacitor according to claim 4, wherein the nitrified metal material and the nitrified non-metal material are respectively TiN and SiN.

7. A capacitor according to claim 2, wherein the second barrier is a conductive barrier and covers all surfaces of the lower electrode.

8. A capacitor according to claim 1, wherein the dielectric is made of silicon oxide and the barrier is made of a nitrified metal material having conductivity.

9. A capacitor according to claim 8, wherein the nitrified metal material is TaN.

10. A capacitor according to claim 8, wherein the nitrified metal material is TiN.

* * * * *